«12» United States Patent
Wang et al.

(10) Patent No.: US 12,185,623 B2
(45) Date of Patent: Dec. 31, 2024

(54) 2D ORGANIC-INORGANIC HYBRID PEROVSKITES AND USES THEREOF

(71) Applicant: Huawei Technologies Canada Co., Ltd., Kanata (CA)

(72) Inventors: Peixi Wang, Toronto (CA); Amin Morteza Najjarian, Toronto (CA); Sjoerd Hoogland, Toronto (CA); Edward Hartley Sargent, Toronto (CA)

(73) Assignee: HUAWEI TECHNOLOGIES CANADA CO., LTD., Kanata (CA)

( * ) Notice: Subject to any disclaimer, the term of this patent is extended or adjusted under 35 U.S.C. 154(b) by 27 days.

(21) Appl. No.: 17/464,630

(22) Filed: Sep. 1, 2021

(65) Prior Publication Data

US 2022/0069236 A1  Mar. 3, 2022

Related U.S. Application Data

(60) Provisional application No. 63/073,711, filed on Sep. 2, 2020.

(51) Int. Cl.
*H01L 51/00* (2006.01)
*C07F 7/24* (2006.01)
*C09K 11/06* (2006.01)
*H10K 85/30* (2023.01)
*H01G 9/20* (2006.01)
*H10K 30/10* (2023.01)
*H10K 50/11* (2023.01)

(52) U.S. Cl.
CPC ............. *H10K 85/30* (2023.02); *C07F 7/24* (2013.01); *C09K 11/06* (2013.01); *C09K 2211/1007* (2013.01); *C09K 2211/188* (2013.01); *H01G 9/2009* (2013.01); *H10K 30/10* (2023.02); *H10K 50/11* (2023.02)

(58) Field of Classification Search
CPC .......... H10K 85/50; H10K 30/40; C07F 7/30; C07F 7/24; C07F 7/22; C07F 1/08; C07F 5/00; Y10S 502/525; C04B 35/4682; C04B 35/4686; C04B 2235/768; C25B 11/0773; C01P 2002/34; B01J 23/002; G11C 2213/31; C09D 11/38; C09D 11/102
See application file for complete search history.

(56) References Cited

U.S. PATENT DOCUMENTS

2022/0102660 A1*  3/2022  Lee .................... H10K 50/115
2022/0194969 A1*  6/2022  Lee .................... C09K 11/664

FOREIGN PATENT DOCUMENTS

WO    WO-2020018456 A1 *  1/2020

OTHER PUBLICATIONS

P. Wang et al., 11 The Journal of Physical Chemistry Letters, 10144-10149 (2020) (Year: 2020).*
Y. Qiu et al., 125 The Journal of Physical Chemistry C, 1256-1268 (2021) (Year: 2021).*
W. Shi et al., The Journal of Physical Chemistry Letters, 4052-4058 (2021) (Year: 2021).*
W. Li et al., 2 Nature Reviews Materials (2017) (Year: 2017).*
H. Harms et al., 176 Faraday Discuss., 251-269 (2014) (Year: 2014).*
Dieter, W., "CH3NH3PbX3, ein Pb(II)-System mit kubischer Perowskitstruktur / CH3NH3PbX3, a Pb(II)-System with Cubic Perovskite Structure", Z. Naturforsch. B , Aug. 21, 1978, 33, 1443-1445.
Stranks, S. D.; Snaith, H. J., "Metal-halide perovskites for photovoltaic and light-emitting devices", Nature Nanotech, May 7, 2015, 10, 391-402.
Zhang, F.; Lu, H.; Tong, J.; Berry, J.J.; Beard, M. C.; Zhu, K., "Advances in two-dimensional organic-inorganic hybrid perovskites", Energy Environ. Sci. 2020, 13, 1154-1186.
Mitzi, D. B. Synthesis, Crystal Structure, and Optical and Thermal Properties of (C4H9NH3)2MI4 (M=Ge, Sn, Pb). Chem. Mater. 1996, 8, 791-800, DOI: 10.1021/cm9505097.
Mitzi, D. B.; Dimitrakopoulos, C. D.; Kosbar, L. L. Structurally Tailored Organic-Inorganic Perovskites: Optical Properties and Solution-Processed Channel Materials for Thin-Film Transistors. Chem. Mater. 2001, 13, 3728-3740, DOI: 10.1021/cm010105g.
Xu, Z.; Mitzi, D. B. Snl42-Based Hybrid Perovskites Templated by Multiple Organic Cations: Combining Organic Functionalities through Noncovalent Interactions. Chem. Mater. 2003, 15, 3632-3637, DOI: 10.1021/cm034267j.
Xu, Z.; Mitzi, D. B .; Dimitrakopoulos, C. D.; Maxcy, K. R. Semiconducting Perovskites (2-XC6H4C2H4NH3)2Snl4 (X=F, Cl, Br): Steric Interaction between the Organic and Inorganic Layers. Inorg. Chem. 2003, 42, 2031-2039, DOI: 10.1021/ic0261474.
Xu, Z.; Mitzi, D. B.; Medeiros, D. R. [(CH3)3NCH2CH2NH3]Snl4: A Layered Perovskite with Quaternary/Primary Ammonium Dications and Short Interlayer Iodine-Iodine Contacts. Inorg. Chem. 2003, 42, 1400-1402, DOI: 10.1021/c0261981.
Tremblay, M.-H.; Bacsa, J.; Zhao, B.; Pulvirenti, F.; Barlow, S.; Marder, S. R. Structures of (4-Y-C6H4CH2NH3)2PbI4 {Y =H, F, Cl, Br, I}: Tuning of Hybrid Organic Inorganic Perovskite Structures from Ruddlesden-Popper to Dion-Jacobson Limits. Chem. Mater. 2019, 31, 6145-6153, DOI: 10.1021/acs.chemmater.9b01564.
Du, K.-z ; Tu, Q.; Zhang, X.; Han, Q.; Liu, J.; Zauscher, S.; Mitzi, D. B. Two-Dimensional Lead(II) Halide-Based Hybrid Perovskites Templated by Acene Alkylamines: Crystal Structures, Optical Properties, and Piezoelectricity. Inorg. Chem. 2017, 56, 9291-9302, DOI: 10.1021/acs.inorgchem.7b01094.

(Continued)

*Primary Examiner* — Alexander R Pagano

(57) ABSTRACT

Novel 2D organic-inorganic hybrid perovskites, including (4-CF$_3$—PMA)$_2$PbI$_4$, that emit in the blue spectral region, and methods for making same. The CF$_3$-substituted material exhibits a ~0.16 eV larger bandgap than corresponding halogen-substituted materials. This family of materials offers a degree of freedom in tuning 2D perovskites to specific bandgaps for optoelectronic applications. These materials are highly stable, easily synthesized, and do not suffer from phase separation.

5 Claims, 10 Drawing Sheets

(56) References Cited

OTHER PUBLICATIONS

Straus, D. B.; Iotov, N.; Gau, M. R.; Zhao, Q.; Carroll, P. J.; Kagan, C. R. Longer Cations Increase Energetic Disorder In Excitonic 2D Hybrid Perovskites. J. Phys. Chem. Lett. 2019, 10, 1198-1205, DOI: 10.1021/acs.jpclett.9b00247.

Sourisseau, S.; Louvain, N.; Bi, W.; Mercier, N.; Rondeau, D.; Boucher, F.; Buzaré, J.-Y.; Legein, C. Reduced Band Gap Hybrid Perovskites Resulting from Combined Hydrogen and Halogen Bonding at the Organic-Inorganic Interface. Chem. Mater. 2007, 19, 600-607, DOI: 10.1021/cm062380e.

Schmitt, T.; Bourelle, S.; Tye, N.; Soavi, G.; Bond, A. D.; Feldmann, S.; Traore, B.; Katan, C.; Even, J.; Dutton, S. E.; Deschler, F. Control of Crystal Symmetry Breaking with Halogen-Substituted Benzylammonium in Layered Hybrid Metal-Halide Perovskites. J. Am. Chem. Soc. 2020, 142, 5060-5067, DOI: 10.1021/jacs.9b11809.

Mantsyzov, A. B.; Sokolov, M. N.; Ivantcova, P. M.; Brase, S.; Polshakov, V. I.; Kudryavtsev, K. V. Interplay of Pyrrolidine Units with Homo/Hetero Chirality and CF3-Aryl Substituents on Secondary Structures of β-Proline Tripeptides in Solution. J. Org. Chem. 2020, DOI: 10.1021/acs.joc.0c00598.

Nagai, T.; Nishioka, G.; Koyama, M.; Ando, A.; Miki, T.; Kumadaki, I. Reactions of trifluoromethyl ketones. IX. Investigation of the steric effect of a trifluoromethyl group based on the stereochemistry on the dehydration of trifluoromethyl homoallyl alcohols. J. Fluorine Chem. 1992, 57, 229-237, Doi: 10.1016/S0022-1139(00)82835-3.

Suzuki, M.; Okada, T.; Taguchi, T.; Hanzawa, Y.; Iitaka, Y. Intramolecular Diels-Alder reactions of furan derivatives: Steric and electronic effects of trifluoromethyl groups. J. Fluorine Chem. 1992, 57, 239-243, DOI: 10.1016/S0022-1139(00)82836-5.

Corbett, M. S.; Liu, X.; Sanyal, A.; Snyder, J. K. Cycloadditions of chiral anthracenes: effect of the trifluoromethyl group. Tetrahedron Lett. 2003, 44, 931-935, DOI: 10.1016/S0040-4039(02)02766-1.

Katagiri, T.; Uneyama, K. Stereospecific substitution at α-carbon to trifluoromethyl group: Application to optically active fluorinated amino acid syntheses. Chirality 2003, 15, 4-9, DOI: 10.1002/chir.10160.

Balasundaram, R.; Jiang, S.; Belak, J. Structural and rheological properties of n-decane confined between graphite surfaces. Chem. Eng. J. 1999, 74, 117-127, DOI: 10.1016/S1385-8947(99)00063-7.

Zhang, L.; Balasundaram, R.; Gehrke, S. H.; Jiang, S. Nonequilibrium molecular dynamics simulations of confined fluids in contact with the bulk. J. Chem. Phys. 2001, 114, 6869-6877, DOI: 10.1063/1.1359179.

Filip et al., "Steric engineering of metal-halide perovskites with tunable optical band gaps", Nature Communications, Dec. 15, 2014, 9 pages.

Jeremy L. Knutson et al., Tuning the Band Gap in Hybrid Tin Iodide Perovskite Semiconductors Using Structural Templating, Inorganic Chemistry, vol. 44, No. 13, 2005, total 7 pages.

Wenda Shi et al., Efficient and Stable Perovskite Solar Cells with a Superhydrophobic Two-Dimensional Capping Layer, 2021 American Chemical Society, total 7 pages.

Yuankun Qiu et al, Tuning the Interfacial Dipole Moment of Spacer Cations for Charge Extraction in Efficient and Ultrastable Perovskite Solar Cells, 2021 American Chemical Society, total 13 pages.

Pei-Xi Wang et al, Structural Distortion and Bandgap Increase of Two-Dimensional Perovskites Induced by Trifluoromethyl Substitution on Spacer Cations, 2020 American Chemical Society, total 6 pages.

\* cited by examiner

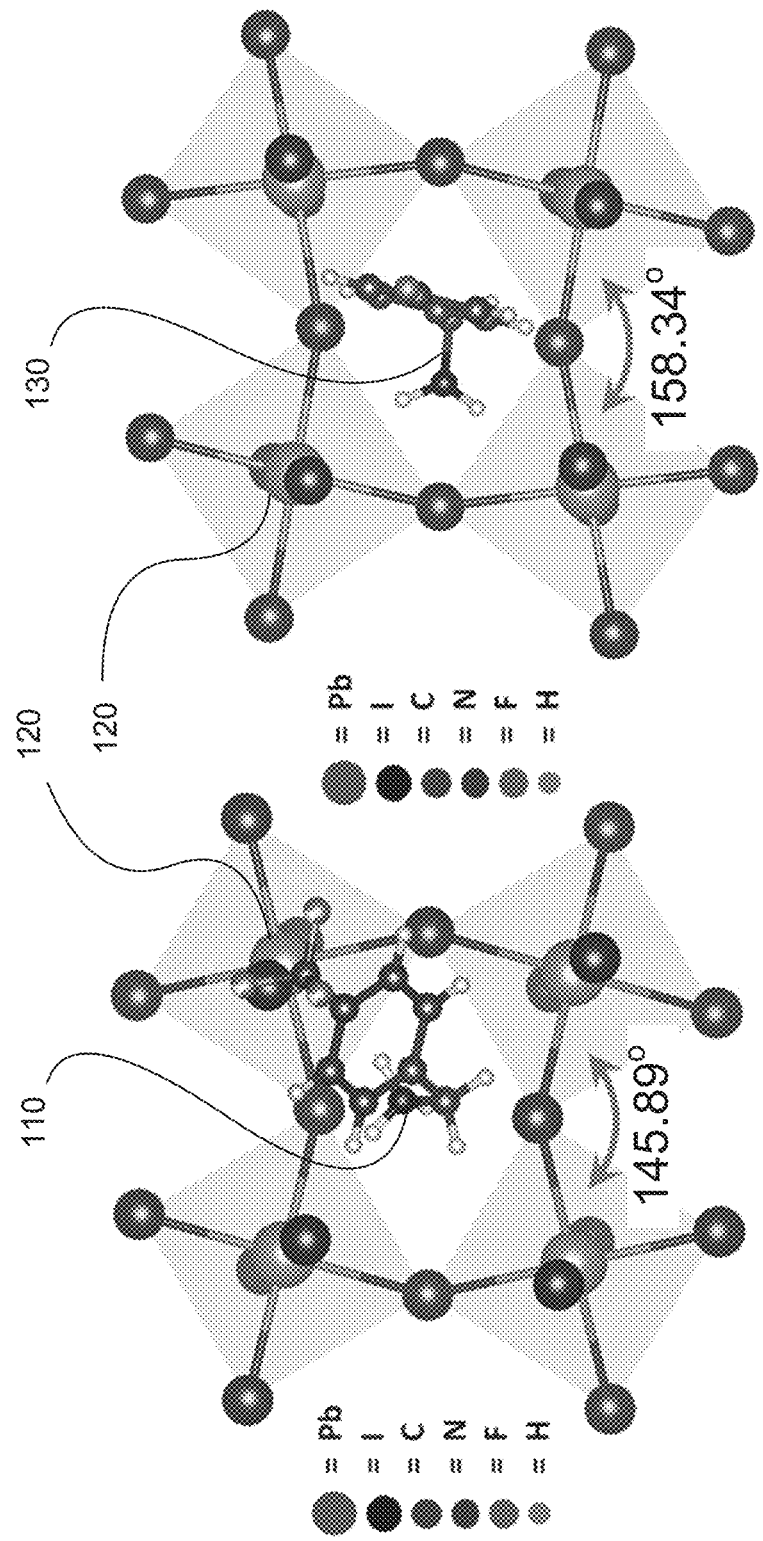

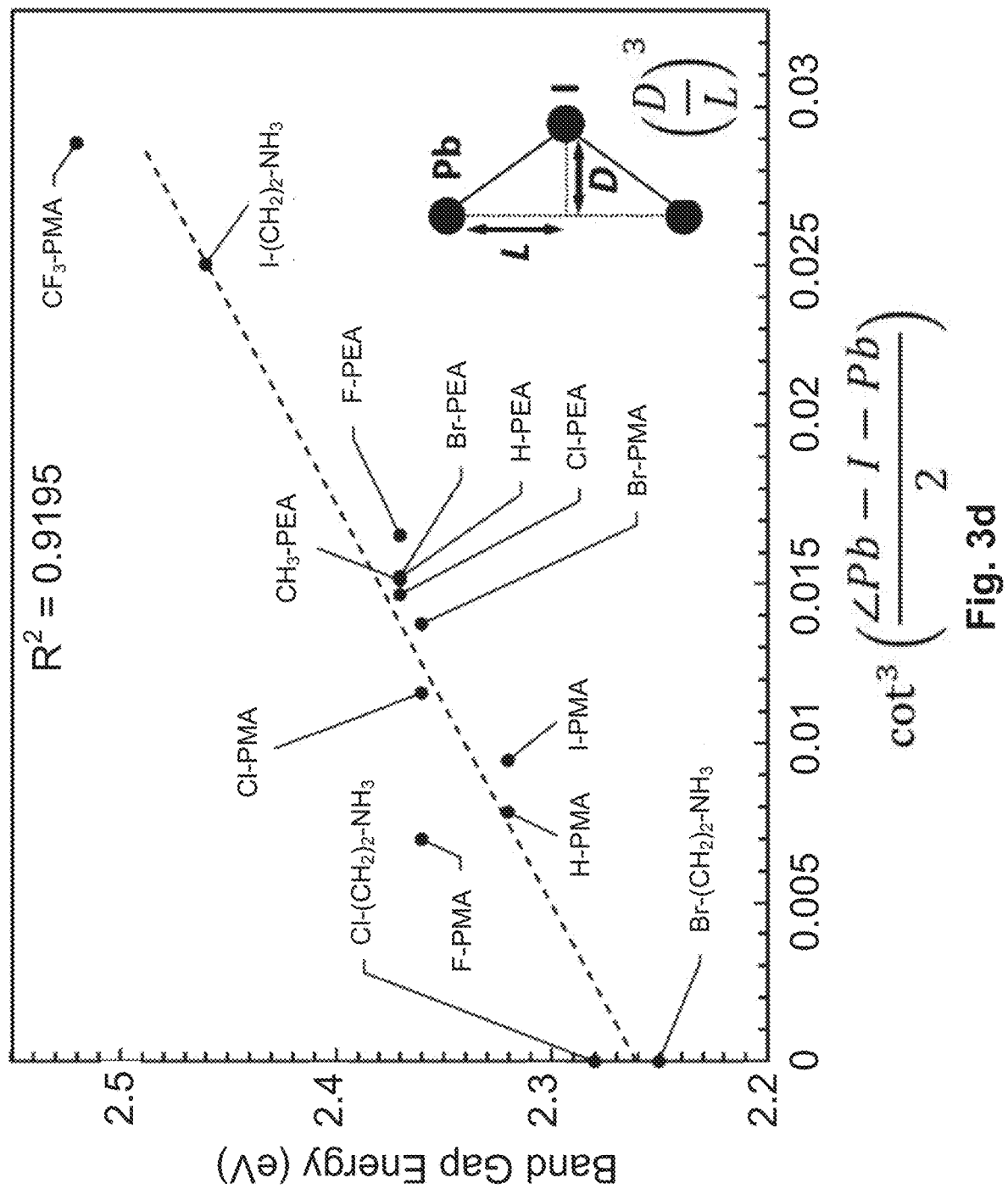

2D ORGANIC-INORGANIC HYBRID PEROVSKITES AND USES THEREOF

CROSS-REFERENCE TO RELATED APPLICATIONS

The present application claims the benefit of priority to U.S. Provisional Patent Application Ser. No. 63/073,711, entitled "Structural Distortion and Bandgap Increase of 2D Perovskites Induced by Trifluoromethyl-Substitution on Spacer Cations," filed Sep. 2, 2020, herein incorporated wholly by reference.

TECHNICAL FIELD OF THE INVENTION

This invention pertains generally to the field of optoelectronic devices and in particular, to systems and methods for adjusting the bandgap of certain materials and therefore their optical and electronic properties.

BACKGROUND

Organic-inorganic hybrid metal-halide perovskites have attracted scientific and technological interest in the past decade (1,2). Two-dimensional (2D) metal halide perovskites—in which the inorganic framework is separated by bulky organic spacers—have gained recent interest due to their promising stability, high photoluminescence quantum yield (PLQY) and narrow emission linewidths.

Approaches to engineering the bandgap of semiconducting materials, e.g., hybrid perovskites, particularly to achieve blue emission, are of interest in display technologies. Current methods for tuning the bandgaps of perovskites, such as the incorporation of mixed halide anions have drawbacks like phase separation and/or difficulty in synthesis.

In these materials, the negatively-charged metal-halide octahedra are arranged into parallel planes fully separated by cationic organic molecules (3). The bandgap and therefore the optical and electronic properties of 2D tin and lead iodide perovskites could be modified by adjusting the angular distortion between adjacent metal-halide octahedra (4-10). The bandgap of 2D perovskites increases as the metal-halide-metal bond angle deviates from the ideal value of 180°. For perovskites consisting of organic ammonium (R—$NH_3$) spacer cations, this angular distortion is attributed to the penetration of cationic —$NH_3^+$ groups below the planes of axial halogen atoms (11), determined by intermolecular interactions among the organic —R moieties. However, these methods have produced materials that suffer from phase separation and/or are difficult to synthesize.

There is a need for highly stable materials that are easily synthesized, and which do not suffer from phase separation.

This background information is provided to reveal information believed by the applicant to be of possible relevance to the present invention. No admission is necessarily intended, nor should be construed, that any of the preceding information constitutes prior art against the present invention.

SUMMARY

An object of the present invention is to provide 2D organic-inorganic hybrid perovskites and uses thereof. In accordance with an aspect of the present invention, there is provided a 2D organic-inorganic hybrid perovskite of Formula (I): (R—$NH_3^+$)$_2MX_4$, wherein R is:

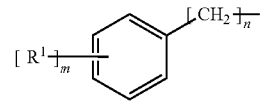

wherein $R^1$ is $CF_3$ or $CF_2CF_3$; m is 1 or 2; and n is 1 or 2; M is Pb, Sn or Ge; and X is I, Br or Cl.

In accordance with another aspect of the present invention, there are provided uses of an organic-inorganic hybrid perovskite as defined of the present invention as a semiconducting material in optoelectronic devices, such as light-emitting diodes, laser diodes, photodiodes and solar cells.

In accordance with another aspect of the present invention, there is provided a method for preparing a 2D organic-inorganic hybrid perovskite of the present invention, comprising the steps of: providing a hot aqueous solution comprising HX, wherein X is I, Br or Cl; a metal cation, wherein $M^{2+}$ is $Pb^{2+}$, $Sn^{2+}$ or $Ge^{2+}$; and an amine having the formula:

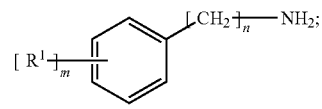

wherein $R^1$ is $CF_3$ or $CF_2CF_3$; m is 1 or 2; and n is 1 or 2; cooling the hot solution without disturbance until the solution reaches a temperature of about 0° C. to about 25° C. and crystals of the organic-inorganic hybrid perovskite form; and collecting, washing and drying the crystals of the organic-inorganic hybrid perovskite.

BRIEF DESCRIPTION OF THE DRAWINGS

FIGS. 1A and 1C illustrate the crystal structure of (4-$CF_3$—PMA)$_2$PbI$_4$, in accordance with one embodiment of the present invention.

FIGS. 1B and 1D illustrate the crystal structure of the prior art perovskite (F—PMA)$_2$PbI$_4$.

FIG. 3D is a graph illustrating the relationship between the photoluminescence bandgap of 2D lead iodide perovskites, including (4-CF₃—PMA)₂PbI₄, in accordance with one embodiment of the present invention.

It will be noted that throughout the appended drawings, like features are identified by like reference numerals.

DETAILED DESCRIPTION

Figures 1A, 1B:
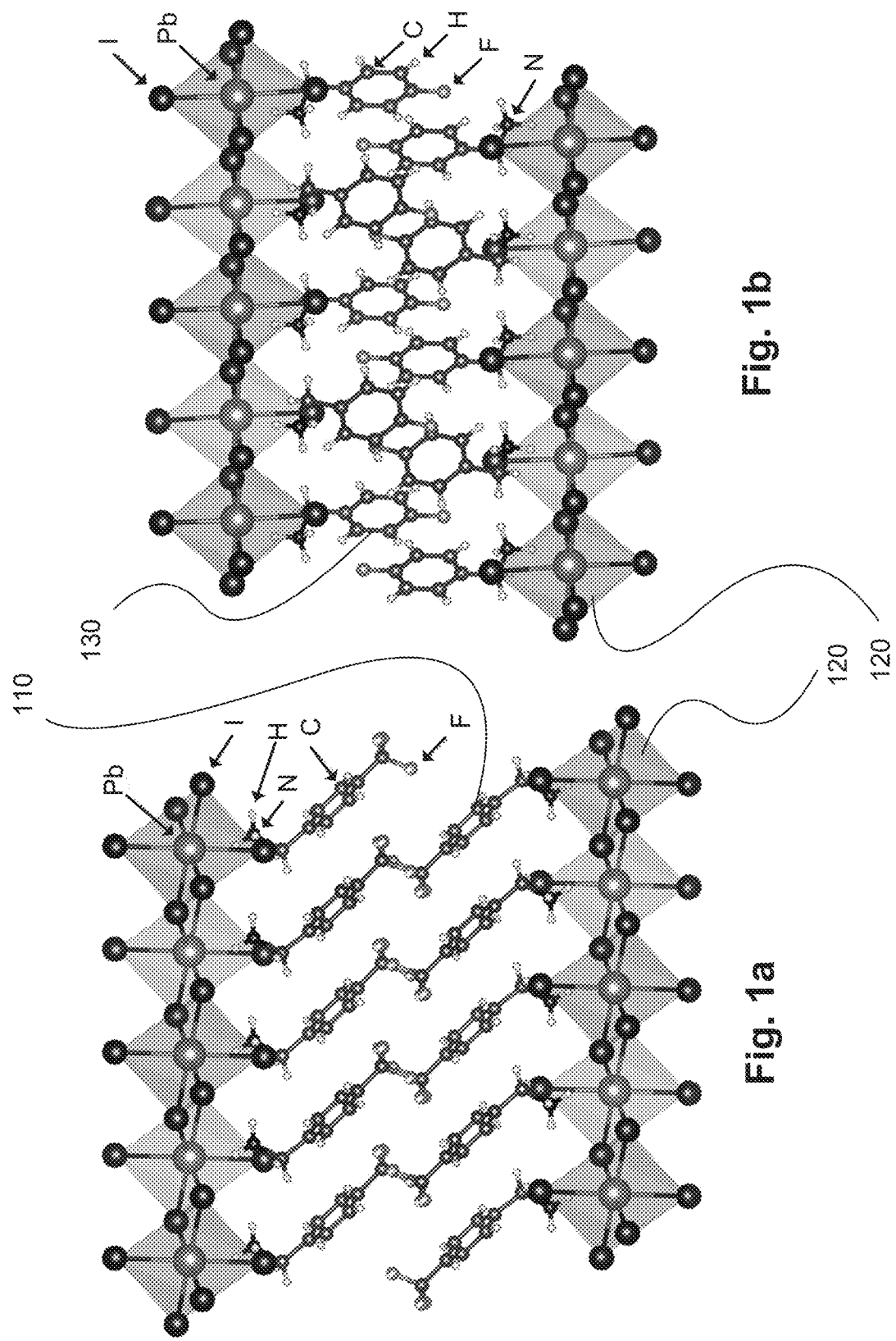

The present invention relates to organic-inorganic hybrid perovskite materials which have been observed to demonstrate blue-shifted photoluminescence. In the hybrid perovskite materials of the present invention, a novel spacer cation is employed to vary the angular distortion between adjacent metal-halide octahedra from the ideal value of 180°, thereby leading to the observed change in the bandgap and optical and electronic properties of the 2D perovskites.

The spacer cation of the present invention provides a hybrid perovskite that exhibits blue-shifted photoluminescence not previously achieved with spacer cations of the prior art.

The 2D organic-inorganic hybrid perovskite materials of the present invention are suitable for use as a semiconducting material in optoelectronic devices that can make direct conversions between photons and photons for light generation applications, and conversion between electrons and photons, such as light-emitting diodes, laser diodes, photo diodes and solar cells. The long-term stability of these hybrid perovskite materials also makes them particularly suitable for incorporation into such optoelectronic devices.

In accordance with the present invention, the 2D organic-inorganic hybrid perovskite materials are of the general formula $(R-NH_3^+)_2MX_4$ (Formula (I)), wherein R is:

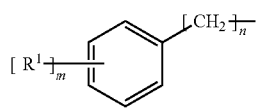

and wherein $R^1$ is fluorinated methyl or ethyl; m is 1 or 2; and n is 1 or 2; M is Pb, Sn or Ge; and X is I, Br or Cl. The phenyl group may be substituted at one or more of the 2-, 3- or 4-positions with the fluorinated alkyl substituents.

As used herein, the term "spacer cations" is used to refer to organic ammonium ligands of the general formula $R-NH_3^+$, which form a layer between two metal-halide perovskite layers, wherein the ammonium portion of the spacer interacts with the metal-halide octahedral units.

As used herein, the term "PMA" is the abbreviation for phenylmethylammonium and the term "PEA" is the abbreviation for phenylethylammonium.

In one embodiment, the spacer cation is a compound of the Formula (II):

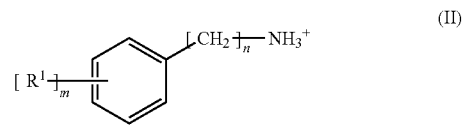

wherein $R^1$ is $CF_3$ or $CF_2CF_3$; m is 1 or 2; and n is 1 or 2.

In one embodiment, the spacer cation is selected from 4-CF₃—PMA, 4-CF₃—PEA, 3-CF₃CF₂—PMA or 3-CF₃CF₂—PEA.

In a preferred embodiment, the spacer cation is 4-CF₃—PMA.

In one embodiment, the metal halide (hybrid) perovskite is selected from (4-CF₃—PMA)₂PbI₄, (4-CF₃—PEA)₂PbI₄, (4-CF₃CF₂—PMA)₂PbI₄ or (4-CF₃CF₂—PEA)₂PbI₄.

In one embodiment, the metal halide (hybrid) perovskite is selected from (3-CF₃-PMA)₂PbI₄, (3-CF₃—PEA)₂PbI₄, (3-CF₃CF₂—PMA)₂PbI₄, or (3-CF₃CF₂—PEA)₂PbI₄.

In a preferred embodiment, the metal halide (hybrid) perovskite is (4-CF₃—PMA)₂PbI₄.

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

The extent by which the bandgap of 2D perovskites can be enlarged by structural distortion was evaluated by reviewing the relationships between the photoluminescence (PL) emission wavelength and crystal structure in 2D lead iodide perovskites having different organic spacer cations. A comparison of selected structural and optical properties between (4-CF₃-PMA)₂PbI₄ and prior art 2D lead iodide perovskites of the formula A₂PbI₄ (where A is an organic spacer cation), is summarized in Table 1. In the case of spacers made up of unsubstituted, and para-halogen/methyl-substituted, phenylmethylammonium (4-Y—C₆H₄CH₂NH₃⁺ where Y is the substituent group, abbreviated Y-PMA) and 2-phenylethylammonium (4-Y—C₆H₄CH₂CH₂NH₃⁺, abbreviated as Y-PEA), the corresponding 2D perovskites (Y-PMA)₂PbI₄ (Y=H, F, Cl, Br, I) and (Y-PEA)₂PbI₄ (Y=H, F, Cl, Br, CH₃) exhibit similar PL bandgaps in the range of 2.32 to 2.37 eV, where the Pb—I—Pb bond angle varies from 158.4° to 151.4° and the interlayer spacing distance ranges from 13.66 to 17.08 Å.

TABLE 1

| Spacer Cation A | PL Bandgap (eV) | Pb—I—Pb Angle (deg) | Intralayer Pb—Pb Distance (Å) | Interlayer Spacing (Å) |
|---|---|---|---|---|
| Br—(CH₂)₂—NH₃ | 2.25 | 176.92, 177.55 | 6.4824, 6.4583 | 10.5702 |
| Cl—(CH₂)₂—NH₃ | 2.28 | 176.68, 178.07 | 6.4312, 6.4703 | 10.3982 |
| H-PMA | 2.32 | 157.52 | 6.2760 | 14.2039 |
| I-PMA | 2.32 | 156.11 | 6.2079 | 16.5128 |
| F-PMA | 2.36 | 158.00, 158.69 | 6.3105, 6.3812 | 13.6635 |
| Cl-PMA | 2.36 | 153.91, 155.07 | 6.1924, 6.2448 | 15.7889 |
| Br-PMA | 2.36 | 151.34, 154.75 | 6.1408, 6.2485 | 15.8030 |
| H-PEA | 2.37 | 151.44, 152.90 | 6.1121, 6.1715 | 16.0831 |
| F-PEA | 2.37 | 151.41 | 6.1185 | 16.3159 |

TABLE 1-continued

| Spacer Cation A | PL Bandgap (eV) | Pb—I—Pb Angle (deg) | Intralayer Pb—Pb Distance (Å) | Interlayer Spacing (Å) |
|---|---|---|---|---|
| Cl-PEA | 2.37 | 152.48 | 6.1389 | 16.6400 |
| Br-PEA | 2.37 | 152.15 | 6.1250 | 17.0645 |
| CH$_3$-PEA | 2.37 | 152.00, 152.42 | 6.1143, 6.1306 | 17.0803 |
| I—(CH$_2$)$_2$—NH$_3$ | 2.46 | 147.38 | 6.1873 | 12.6072 |
| CF$_3$-PMA | 2.52 | 145.89 | 6.0496 | 17.9252 |

It can be seen that when aromatic spacers are used, creating additional separation among the inorganic layers through the use of longer organic moieties does not increase bandgap. Moreover, the much shorter halogen-terminated two-carbon aliphatic spacers Y—(CH$_2$)$_2$—NH$_3$ (Y=Cl, Br, I) do show a significantly enlarged bandgap (~2.46 eV) along with a decreased Pb—I—Pb bond angle of 147.4°; the distortion was shown to be caused by iodine-iodine halogen bonding between the I—(CH$_2$)$_2$—NH$_3$ spacers and perovskite octahedra. The results observed with the prior art spacers suggests that, if the Pb—I—Pb angle is decreased to below 145°, this could further widen the bandgap of 2D perovskites.

To understand why the Y-PMA and Y-PEA spacers do not lead to a significantly distorted lattice, the crystal structures of (Y-PMA)$_2$PbI$_4$ and (Y-PEA)$_2$PbI$_4$ were investigated. Without being bound by theory, it is believed that the attractive π-π and π-halogen interactions between adjacent aromatic rings of these spacers compensate for the intermolecular steric hindrance repulsion.

Accordingly, a synthetic approach focused on increasing steric hindrance was adopted using functional groups that increase repulsive intermolecular interactions to increase the bandgap of 2D perovskites. As shown in the present disclosure, it has been found that fluorinated alkyl groups, including but not limited to trifluoromethyl and pentafluoroethyl groups, can be used to facilitate this since there is a large electrostatic repulsion between, for example, —CF$_3$ groups or between —CF$_3$ and aromatic rings due to the high electron density around trifluoromethyl groups originating from the strong electronegativity of fluorine atoms.

EXAMPLES

Based on the above hypothesis, 4-CF$_3$—PMA cations were selected as organic spacers, with which the 2D lead iodide perovskite was synthesized, (4-CF$_3$—PMA)$_2$PbI$_4$. The optoelectronic and crystallographic properties of the new perovskite were investigated and the resulting perovskite was found to have a highly distorted crystal structure (Pb—I—Pb angle of 145.9°) and a significantly blue-shifted emission compared to its para-halogen substituted prior art analogues (Table 1, 2.52 eV versus ~2.36 eV).

Example 1: Synthesis of (4-CF$_3$—PMA)$_2$PbI$_4$

Materials

Lead(II) iodide (99%, Sigma-Aldrich), 4-(trifluoromethyl)benzylamine (98%, TCI America), 4-fluorobenzylamine (97%, Sigma-Aldrich), hydriodic acid (57 wt. % in H$_2$O, 99.95%, Sigma-Aldrich), hypophosphorous acid solution (50 wt. % in H$_2$O, Sigma-Aldrich), toluene (99.5%, Fisher Chemical), N,N-dimethylformamide (anhydrous, 99.8%, Sigma-Aldrich), and dimethyl sulfoxide (anhydrous, 99.9%, Sigma-Aldrich) were used as received.

(4-CF$_3$—PMA)$_2$PbI$_4$ 2D perovskites were synthesized using a slow cooling crystallization method. A hot (100° C.) aqueous solution containing hydroiodic acid (6.30 mol/L), hypophosphorous acid (1.50 mol/L), lead iodide (0.15 mol/L), and 4-(trifluoromethyl)benzylamine (0.30 mol/L) was allowed to cool slowly to 25° C. in a sealed glass vial without disturbance, giving bright yellow-colored plate-like crystals. The crystals were washed using toluene and dried thoroughly under vacuum at 250° C. Thin films of (4-CF$_3$—PMA)$_2$PbI$_4$ were prepared by spin-coating a solution of the crystals (with a lead concentration of 0.50 mol/L in a 1:1 volumetric mixture of N,N-dimethylformamide and dimethyl sulfoxide) onto oxygen-plasma-treated glass substrates at 4000 rpm for 30 seconds followed by annealing at 100° C. for 10 minutes in air. As controls, (F—PMA)$_2$PbI$_4$ was used, which was synthesized in a similar process by using 4-fluorobenzylamine as the organic precursor, giving orange-colored plate-like crystals.

Example 2: Characterization of (4-CF$_3$—PMA)$_2$PbI$_4$ by X-Ray Diffraction Powder XRD patterns were collected on a Rigaku MiniFlex 600 6G Benchtop powder X-ray diffraction instrument using Cu-Kα radiation (λ=1.5406 Å). Single-crystal X-ray diffraction analysis was obtained on a Bruker Kappa APEX-DUO CCD Diffractometer using Mo-Ka radiation (λ=0.71073 Å).

Figure 1E:
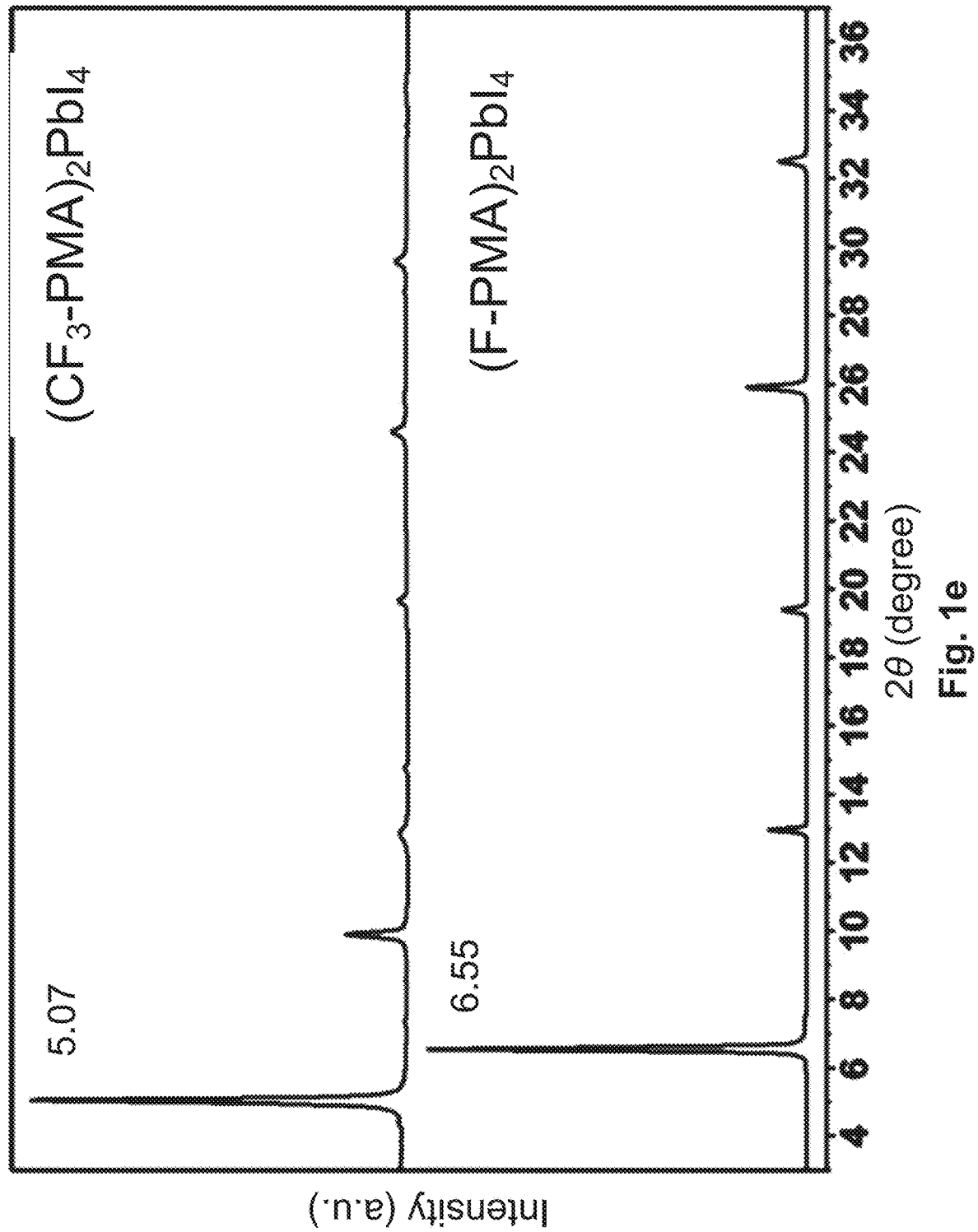
FIG. 1E illustrates the powder X-ray diffraction patterns of spin-coated thin films of (4-$CF_3$—PMA)$_2$PbI$_4$ and (F—PMA)$_2$PbI$_4$.

The crystal structure of (4-CF$_3$—PMA)$_2$PbI$_4$ was investigated using single-crystal X-ray diffraction (XRD). This revealed periodically spaced inorganic sheets consisting of corner-sharing PbI$_6$ octahedra intercalated by layers of 4-CF$_3$—PMA molecules. Unlike in the F—PMA perovskite, the trifluoromethyl group greatly reduces the overlap between oppositely-oriented 4-CF$_3$—PMA spacers within each organic layer (FIGS. 1A and 1B) This eliminates the possibility of π-π stacking or π-halogen bonding between the aromatic moieties of benzylammonium cations, and induces a greater structural distortion in the inorganic PbI$_4^{2-}$ planes (quantitatively described as a smaller Pb—I—Pb bond angle) when compared with (F—PMA)$_2$PbI$_4$ (FIGS. 1C and 1D and Table 1). Both films exhibited high crystallinity as evidenced by sharp peaks in the powder XRD spectra, and the strong periodicity of the peaks is characteristic of layered 2D perovskites (FIG. 1E).

FIG. 1A illustrates the crystal structure obtained with single-crystal X-ray diffraction (XRD) of (4-CF$_3$—PMA)$_2$PbI$_4$, viewed from a direction parallel to the PbI$_4^{2-}$ inorganic layers. The 4-CF$_3$—PMA molecules 110 appear as a spacer layer between planes of the PbI$_4^{2-}$ inorganic layers 120.

FIG. 1B illustrates the crystal structure obtained with single-crystal XRD of (F-PMA)$_2$PbI$_4$ viewed from a direction parallel to the PbI$_4^{2-}$ inorganic layers. The F—PMA molecules 130 appear as a spacer layer between planes of the PbI$_4^{2-}$ inorganic layers 120. Crystallography data for (F—PMA)$_2$PbI$_4$ were obtained from Tremblay et al. in *Chem. Mater.* 2019, 31, 6145-6153.

FIG. 1C illustrates the crystal structure obtained with single-crystal XRD of (4-CF$_3$—PMA)$_2$PbI$_4$ viewed from a direction perpendicular to the PbI$_4^{2-}$ inorganic layers. The 4-CF$_3$—PMA molecules 110 appear approximately centered in a frame of PbI$_4^{2-}$ octahedra from the inorganic layers 120. Excess organic spacer cations have been removed to show the structural distortions of the perovskite lattices.

FIG. 1D illustrates the crystal structure obtained with single-crystal XRD of (F—PMA)$_2$PbI$_4$ viewed from a direction perpendicular to the PbI$_4^{2-}$ inorganic layers. The F—PMA molecules 130 appear approximately centered in a frame of PbI$_4^{2-}$ octahedra from the inorganic layers 120. Excess organic spacer cations have been removed to show the structural distortions of the perovskite lattices.

FIG. 1E shows powder XRD patterns for spin-coated thin films of (4-CF$_3$—PMA)$_2$PbI$_4$ and (F—PMA)$_2$PbI$_4$. A sharp peak at 2θ=5.07 is consistent with (4-CF$_3$—PMA)$_2$PbI$_4$, and a sharp peak at 2θ=6.55 is consistent with (F—PMA)$_2$PbI$_4$. The periodic peaks indicate consistency with layered 2D perovskites.

Example 3: Characterization of (4-CF$_3$—PMA)$_2$PbI$_4$ by UV-VIS Absorption Spectroscopy and Photoluminescence Spectroscopy UV-VIS absorption spectroscopy was performed on a PerkinElmer LAMBDA 950 UV/VIS/NIR spectrophotometer. Photoluminescence spectroscopy was conducted on a Horiba Fluorolog Time Correlated Single Photon Counting system equipped with UV/VIS/NIR photomultiplier tube detectors.

Ultraviolet-visible (UV-VIS) absorption spectroscopy and photoluminescence spectroscopy was used to determine the bandgap of the films, and the bandgap of the trifluoromethyl perovskite material was found to be significantly blue-shifted compared to the fluoride control.

Figure 1F:
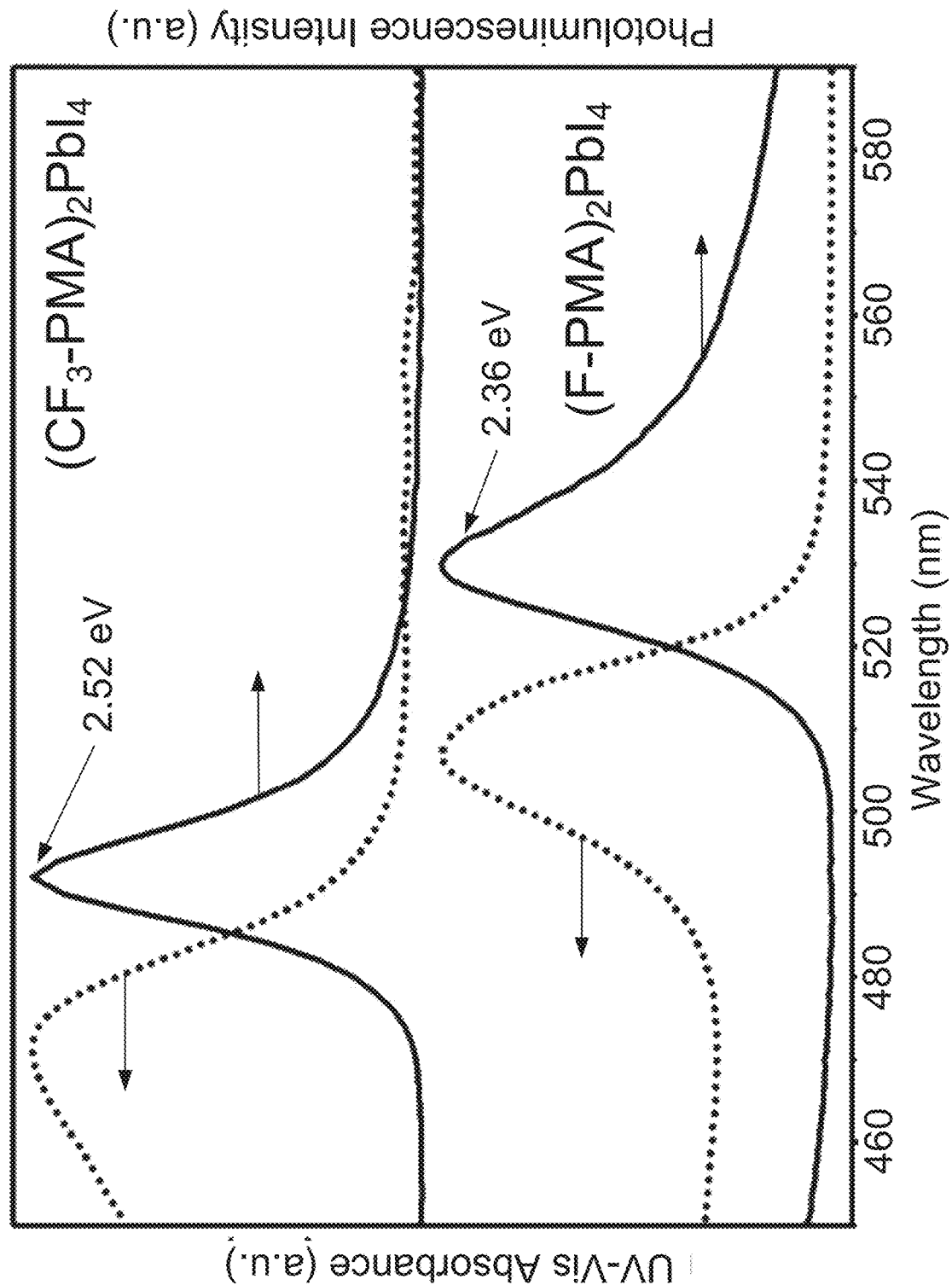
FIG. 1F is a graph illustrating the UV-VIS absorption spectra (dotted curves) and photoluminescence spectra (solid curves) of (4-$CF_3$—PMA)$_2$PbI$_4$ and (F—PMA)$_2$PbI$_4$ films

FIG. 1F shows the UV-VIS absorption (dotted curves) and photoluminescence (solid curves) spectra of (4-CF$_3$—PMA)$_2$PbI$_4$ and (F—PMA)$_2$PbI$_4$ films. The photoluminescence spectrum for (4-CF$_3$—PMA)$_2$PbI$_4$ shows a peak emission of 2.52 eV photons, i.e. 492 nm light, while the peak emission of (F—PMA)$_2$PbI$_4$ occurs at 2.36 eV, i.e. approximately 525.36 nm light.

Example 4: Stability

The synthesized (4-CF$_3$—PMA)$_2$PbI$_4$ perovskite crystals exhibit long-term stability, as (4-CF$_3$—PMA)$_2$PbI$_4$ crystals showed no significant changes in powder X-ray diffraction patterns, UV-VIS absorption spectroscopy or photoluminescence spectroscopy after storage in a sealed container in ambient conditions for 6 months. Without being bound by theory, it is believed that the outstanding hydrophobicity of trifluoromethyl substitution groups on the spacer cations help to prevent moisture-induced degradation.

Example 5: Comparison of Theoretical and Observed Characteristics

To understand better the bandgap increase for the trifluoromethyl substitution, and to evaluate the contribution of structural distortion to the blue-shift versus other changes from different organic spacer cations, density functional theory (DFT) was used to investigate the influence of the Pb—I—Pb bond angle on the highest occupied molecular orbital (HOMO) and lowest unoccupied molecular orbital (LUMO) energy levels of 2D lead iodide perovskites. When a single perovskite layer consisting of corner-sharing PbI$_6$ octahedra was distorted, a nonlinear negative correlation between the bandgap and the Pb—I—Pb bond angle (FIG. 2A) was observed, which is in agreement with the experimental results of Y-PMA, Y-PEA, and also β-substituted ethylamines (FIG. 2B). These results indicate that the blue-shift of (4-CF$_3$—PMA)$_2$PbI$_4$ could be caused by the structural distortion of inorganic perovskite layers.

Figure 2A:
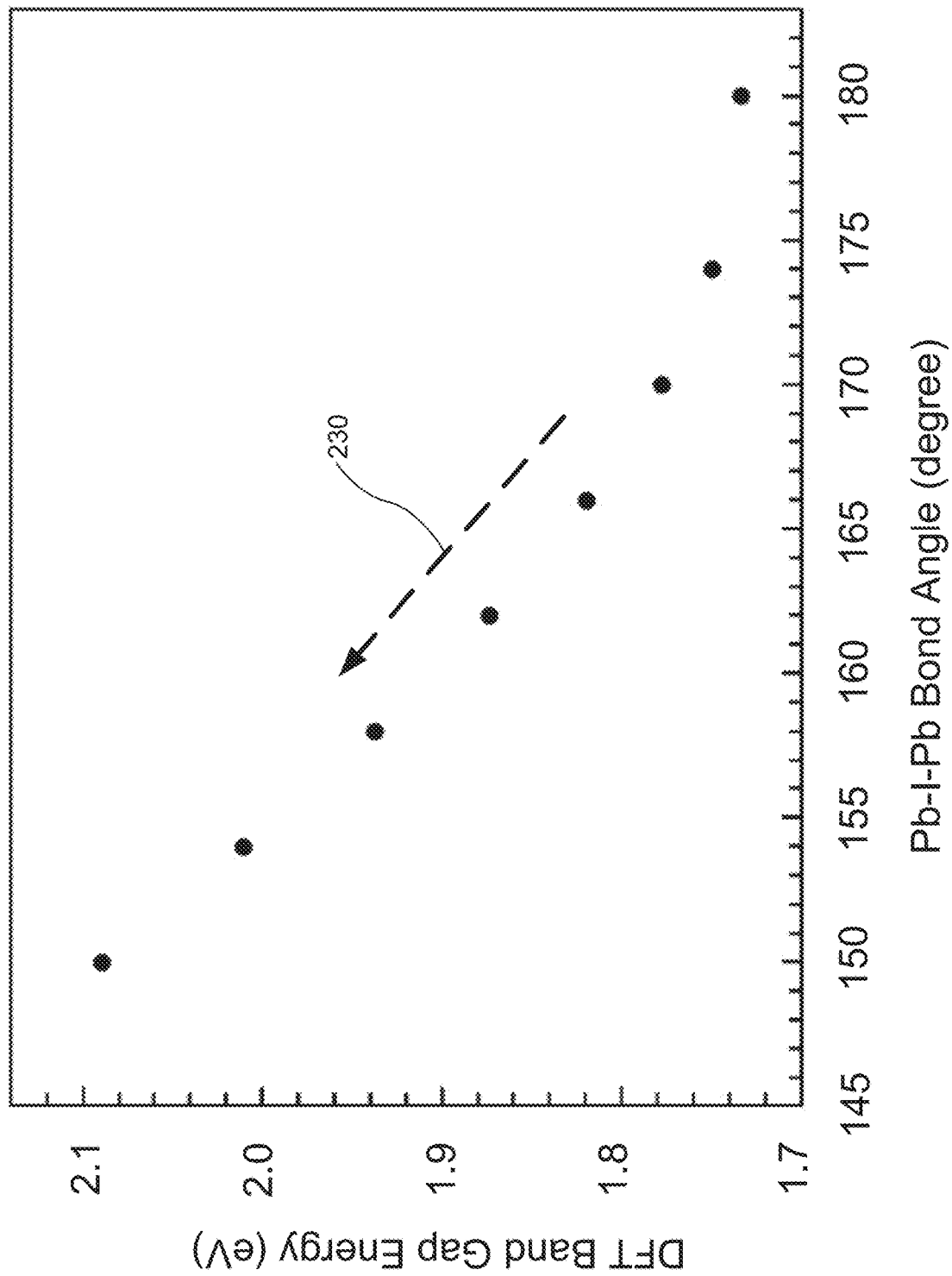
FIG. 2A is a graph illustrating simulated results showing the negative relationship between the bandgap and Pb—I—Pb bond angle of a manually distorted negatively-charged inorganic 2D lead iodide perovskite layer without any ligands.
Figure 2B:
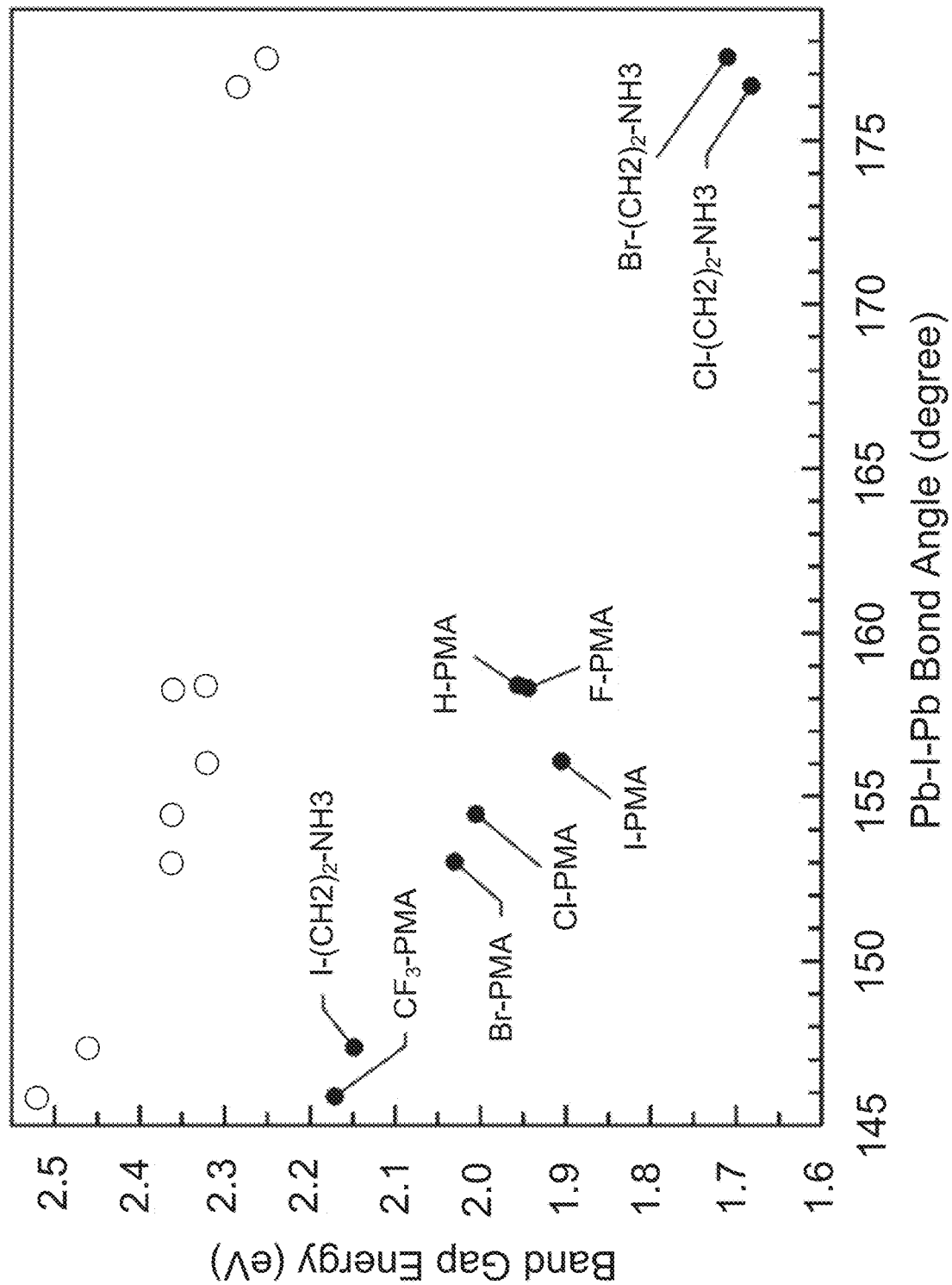
FIG. 2B is a graph illustrating a comparison of experimentally-measured photoluminescence bandgap values (open circles) of 2D lead iodide perovskites, including (4-$CF_3$—PMA)$_2$PbI$_4$, in accordance with one embodiment of the present invention, with those obtained by density functional theory calculations (closed circles) based on single-crystal X-ray diffraction data

FIG. 2A is a graph of the simulated results showing the negative relationship between the bandgap and Pb—I—Pb bond angle of a manually distorted negatively-charged inorganic 2D lead iodide perovskite layer without any ligands. It is seen that, as the Pb—I—Pb bond angle is decreased from undistorted 1800 to highly distorted 150°, the bandgap energy increases from approximately 1.7 eV to 2.1 eV.

FIG. 2B is a graph of the comparison of experimentally-measured photoluminescence bandgap values (open circles) of 2D lead iodide perovskites, including (4-CF$_3$—PMA)$_2$PbI$_4$ of the present invention, with those obtained by density functional theory calculations (closed circles) based on single-crystal X-ray diffraction data. Although experimental points are somewhat greater than DFT values, their relative differences are similar.

Figure 3A:
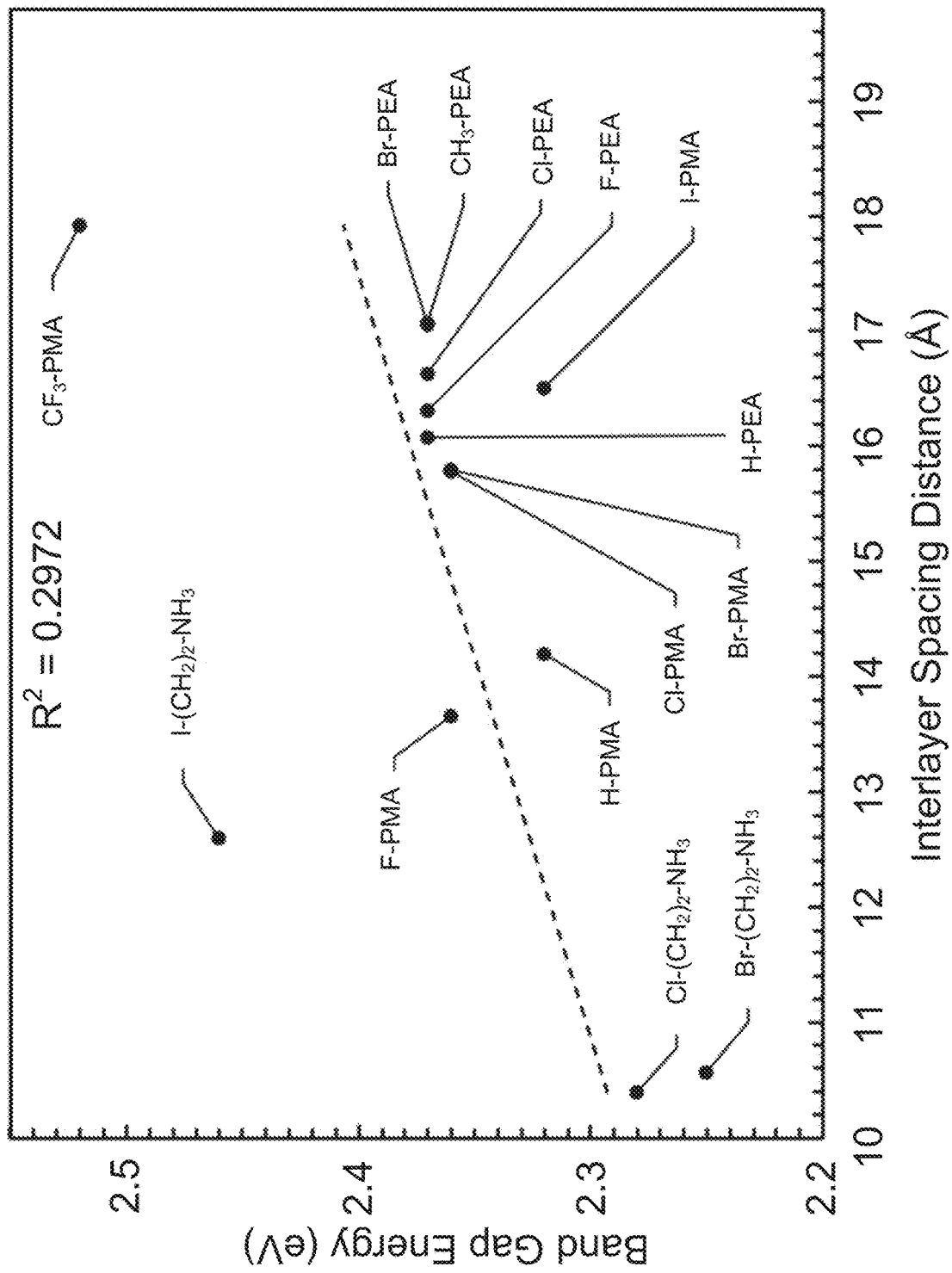
FIG. 3A is a graph illustrating the relationship between the photoluminescence bandgap energy and the interlayer spacing distance of 2D lead iodide perovskites, including (4-$CF_3$—PMA)$_2$PbI$_4$, in accordance with one embodiment of the present invention.
Figure 3B:
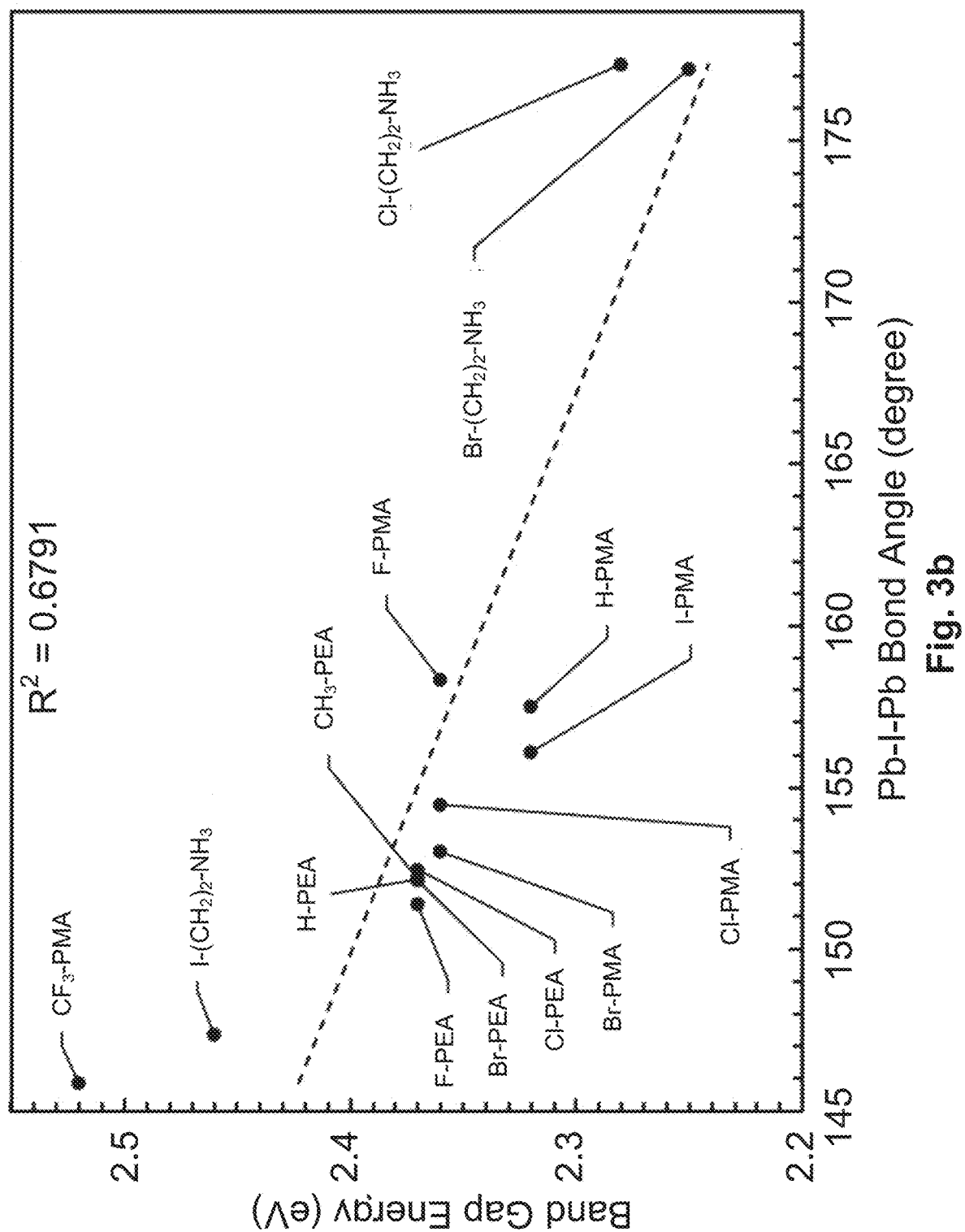
FIG. 3B is a graph illustrating the relationship between the photoluminescence bandgap and the Pb—I—Pb bond angle of 2D lead iodide perovskites, including (4-CF₃—PMA)₂PbI₄, in accordance with one embodiment of the present invention.
Figure 3C:
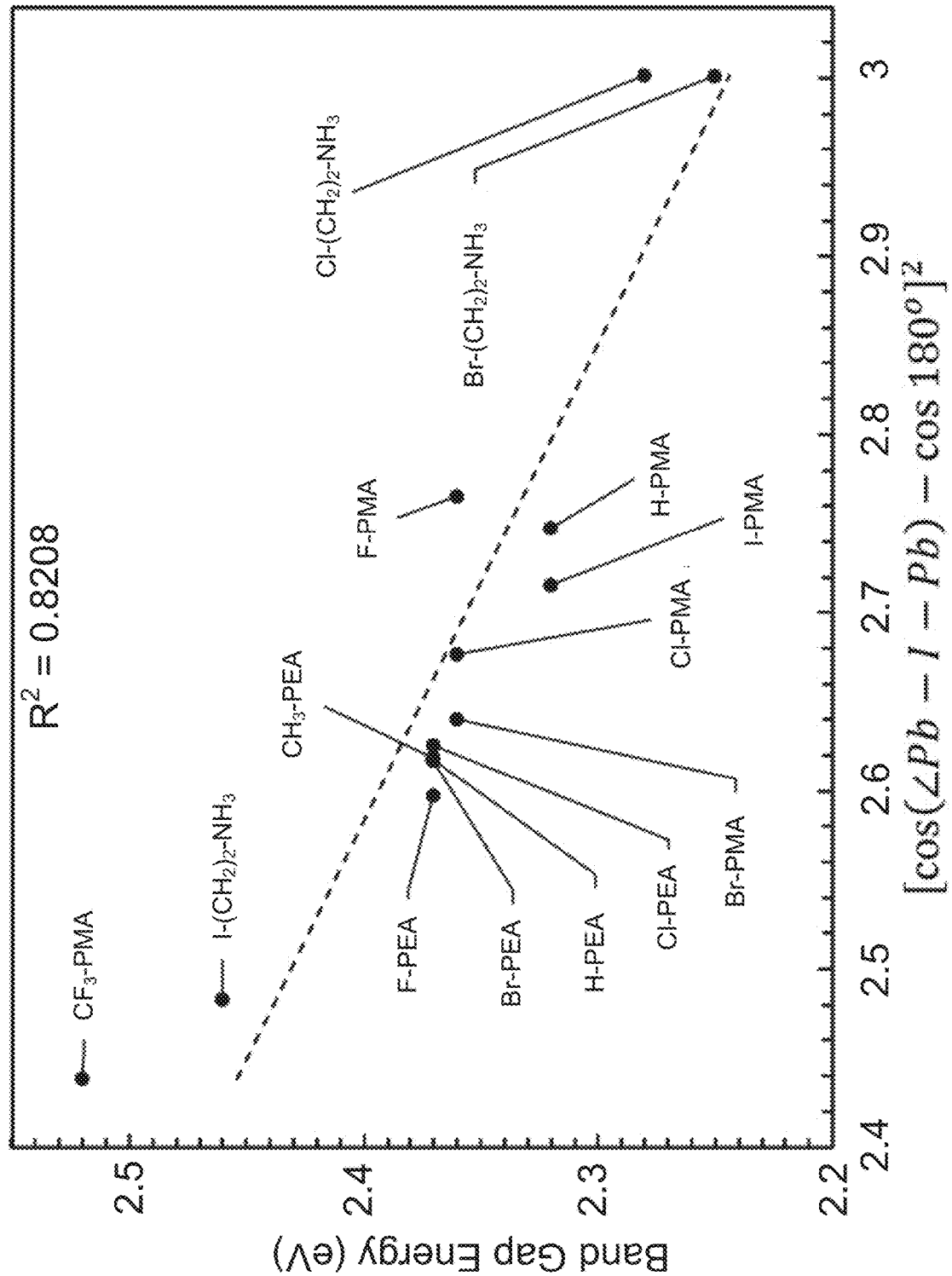
FIG. 3C is a graph illustrating the relationship between the photoluminescence bandgap and the Pb—I—Pb bond angle of 2D lead iodide perovskites, including (4-CF₃—PMA)₂PbI₄, in accordance with one embodiment of the present invention.

Although the positive relationship between structural distortion and bandgap in 2D perovskites has previously been posited, an attempt to make the quantitative link between the crystal structure and bandgap of 2D lead iodide perovskites was carried out by plotting PL bandgap against different structural parameters. This includes the interlayer spacing distance (FIG. 3a) and the Pb—I—Pb bond angle (FIG. 3b). In addition, trigonometric functions including the square of the difference between cosine of the Pb—I—Pb bond angle and cosine 180° were used as part of the cosine-harmonic bond-angle potential energy function, where the undistorted angle of 180° is used as the reference angle (FIG. 3c). The final function used was the cubic value of the cotangent of half the Pb—I—Pb bond angle (FIG. 3d), where the trigonometric function transforms an angular value into a ratio of two lengths that could be directly associated with the distances between metal and halogen atoms. Based on the coefficient of determination (R-squared), a linear correlation between the photoluminescence bandgap and (D/L)$^3$ is plausible.

Here, D is the distance from the midpoint of two lead atoms to the iodide atom that bridges them, and L is half the distance between the two lead atoms (FIG. 3d). This correlation suggests that, in an idealized situation where other distortion effects such as the overlap between nearby iodides are ignored, a PL emission wavelength of 480 nm (2.58 eV) may be achieved if the Pb—I—Pb angle can be decreased to below 142°.

In conclusion, a new type of 2D lead iodide perovskite with the formula (4-CF$_3$—PMA)$_2$PbI$_4$ has been synthesized, which exhibits significantly blue-shifted photoluminescence compared to both its halogen-substituted analogues (Y-PMA)$_2$PbI$_4$ and a series of other 2D perovskites containing aromatic or aliphatic spacer cations. After comparing different structural parameters of these compounds, it was confirmed that this increase in bandgap was a result of the distortion of the inorganic perovskite layers, which was in turn induced by the repulsive intermolecular interactions associated with the trifluoromethyl functional groups. DFT studies were used to account for this phenomenon, and a linear correlation between the bandgap and structural parameters to help estimate the extent of distortion required for deep-blue or violet photoluminescence was also observed. The behavior of organic spacers with perfluorinated substituents suggest an approach to developing perovskite-based blue light-emitting materials for application in laser or display technologies.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

REFERENCES

1. Dieter, W. CH3NH3PbX3, ein Pb(II)-System mit kubischer Perowskitstruktur/CH3NH3PbX3, a Pb(II)—System with Cubic Perovskite Structure. *Z. Naturforsch. B* 1978, 33, 1443-1445, DOI: 10.1515/znb-1978-1214.
2. Stranks, S. D.; Snaith, H. J. Metal-halide perovskites for photovoltaic and light-emitting devices. *Nature Nanotech.* 2015, 10, 391-402, DOI: 10.1038/nnano.2015.90.
3. Zhang, F.; Lu, H.; Tong, J.; Berry, J. J.; Beard, M. C.; Zhu, K. Advances in two-dimensional organic-inorganic hybrid perovskites. *Energy Environ. Sci.* 2020, 13, 1154-1186, DOI: 10.1039/C9EE03757H.
4. Mitzi, D. B. Synthesis, Crystal Structure, and Optical and Thermal Properties of (C4H9NH3)2MI4 (M=Ge, Sn, Pb). *Chem. Mater.* 1996, 8, 791-800, DOI: 10.1021/cm9505097.
5. Mitzi, D. B.; Dimitrakopoulos, C. D.; Kosbar, L. L. Structurally Tailored Organic-Inorganic Perovskites: Optical Properties and Solution-Processed Channel Materials for Thin-Film Transistors. *Chem. Mater.* 2001, 13, 3728-3740, DOI: 10.1021/cm010105g.
6. Xu, Z.; Mitzi, D. B. SnI42-Based Hybrid Perovskites Templated by Multiple Organic Cations: Combining Organic Functionalities through Noncovalent Interactions. *Chem. Mater.* 2003, 15, 3632-3637, DOI: 10.1021/cm034267j.
7. Xu, Z.; Mitzi, D. B.; Dimitrakopoulos, C. D.; Maxcy, K. R. Semiconducting Perovskites (2-XC6H4C2H4NH3)2SnI4 (X=F, Cl, Br): Steric Interaction between the Organic and Inorganic Layers. *Inorg. Chem.* 2003, 42, 2031-2039, DOI: 10.1021/ic0261474.
8. Xu, Z.; Mitzi, D. B.; Medeiros, D. R. [(CH3)3NCH2CH2NH3]SnI4: A Layered Perovskite with Quaternary/Primary Ammonium Dications and Short Interlayer Iodine-Iodine Contacts. *Inorg. Chem.* 2003, 42, 1400-1402, DOI: 10.1021/ic0261981.
9. Knutson, J. L.; Martin, J. D.; Mitzi, D. B. Tuning the Band Gap in Hybrid Tin Iodide Perovskite Semiconductors Using Structural Templating. *Inorg. Chem.* 2005, 44, 4699-4705, DOI: 10.1021/ic050244q.
10. Tremblay, M.-H.; Bacsa, J.; Zhao, B.; Pulvirenti, F.; Barlow, S.; Marder, S. R. Structures of (4-Y-C6H4CH2NH3)2PbI4 {Y=H, F, Cl, Br, I}: Tuning of Hybrid Organic Inorganic Perovskite Structures from Ruddlesden-Popper to Dion-Jacobson Limits. *Chem. Mater.* 2019, 31, 6145-6153, DOI: 10.1021/acs.chemmater.9b01564.
11. Du, K.-z.; Tu, Q.; Zhang, X.; Han, Q.; Liu, J.; Zauscher, S.; Mitzi, D. B. Two-Dimensional Lead(II) Halide-Based Hybrid Perovskites Templated by Acene Alkylamines: Crystal Structures, Optical Properties, and Piezoelectricity. *Inorg. Chem.* 2017, 56, 9291-9302, DOI: 10.1021/acs.inorgchem.7b01094.
12. Straus, D. B.; Iotov, N.; Gau, M. R.; Zhao, Q.; Carroll, P. J.; Kagan, C. R. Longer Cations Increase Energetic Disorder in Excitonic 2D Hybrid Perovskites. *J. Phys. Chem. Lett.* 2019, 10, 1198-1205, DOI: 10.1021/acs.jpclett.9b00247.
13. Sourisseau, S.; Louvain, N.; Bi, W.; Mercier, N.; Rondeau, D.; Boucher, F.; Buzaré, J.-Y.; Legein, C. Reduced Band Gap Hybrid Perovskites Resulting from Combined Hydrogen and Halogen Bonding at the Organic-Inorganic Interface. *Chem. Mater.* 2007, 19, 600-607, DOI: 10.1021/cm062380e.
14. Schmitt, T.; Bourelle, S.; Tye, N.; Soavi, G.; Bond, A. D.; Feldmann, S.; Traore, B.; Katan, C.; Even, J.; Dutton, S. E.; Deschler, F. Control of Crystal Symmetry Breaking with Halogen-Substituted Benzylammonium in Layered Hybrid Metal-Halide Perovskites. *J. Am. Chem. Soc.* 2020, 142, 5060-5067, DOI: 10.1021/jacs.9b11809.
15. Mantsyzov, A. B.; Sokolov, M. N.; Ivantcova, P. M.; Brase, S.; Polshakov, V. I.; Kudryavtsev, K. V. Interplay of Pyrrolidine Units with Homo/Hetero Chirality and CF3-Aryl Substituents on Secondary Structures of β-Proline Tripeptides in Solution. *J. Org. Chem.* 2020, DOI: 10.1021/acs.joc.0c00598.
16. Nagai, T.; Nishioka, G.; Koyama, M.; Ando, A.; Miki, T.; Kumadaki, I. Reactions of trifluoromethyl ketones. IX. Investigation of the steric effect of a trifluoromethyl group based on the stereochemistry on the dehydration of trifluoromethyl homoallyl alcohols. *J. Fluorine Chem.* 1992, 57, 229-237, DOI: 10.1016/S0022-1139(00)82835-3.
17. Suzuki, M.; Okada, T.; Taguchi, T.; Hanzawa, Y.; Iitaka, Y. Intramolecular Diels-Alder reactions of furan derivatives: Steric and electronic effects of trifluoromethyl groups. *J. Fluorine Chem.* 1992, 57, 239-243, DOI: 10.1016/S0022-1139(00)82836-5.
18. Corbett, M. S.; Liu, X.; Sanyal, A.; Snyder, J. K. Cycloadditions of chiral anthracenes: effect of the trifluoromethyl group. *Tetrahedron Lett.* 2003, 44, 931-935, DOI: 10.1016/S0040-4039(02)02766-1.
19. Katagiri, T.; Uneyama, K. Stereospecific substitution at α-carbon to trifluoromethyl group: Application to optically active fluorinated amino acid syntheses. *Chirality* 2003, 15, 4-9, DOI: 10.1002/chir.10160.
20. Balasundaram, R.; Jiang, S.; Belak, J. Structural and rheological properties of n-decane confined between graphite surfaces. *Chem. Eng. J* 1999, 74, 117-127, DOI: 10.1016/S1385-8947(99)00063-7.
21. Zhang, L.; Balasundaram, R.; Gehrke, S. H.; Jiang, S. Nonequilibrium molecular dynamics simulations of confined fluids in contact with the bulk. *J. Chem. Phys.* 2001, 114, 6869-6877, DOI: 10.1063/1.1359179.

What is claimed is:

1. A perovskite material for use in an optoelectronic material, the perovskite material comprising a 2D organic-inorganic hybrid perovskite of Formula (I):

$$(R-NH_3^+)_2MX_4 \quad (I)$$

wherein:

R is

[structure: para-substituted benzene ring with $CH_2-$ group and $R^1$ substituent]

wherein $R^1$ is $CF_3$ or $CF_2CF_3$;

M is Pb, Sn or Ge; and

X is I, Br or Cl.

2. The perovskite material of claim 1 wherein:

M is Pb; and

X is I.

3. The perovskite material of claim 1, wherein $R^1$ is $CF_3$.

4. The perovskite material of claim 1, wherein $R^1$ is $CF_2CF_3$.

5. A perovskite material for use in an optoelectronic material, the perovskite material comprising a 2D organic-inorganic hybrid perovskite of Formula (I):
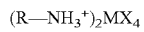 (I)
wherein:
R is
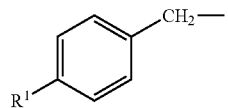
wherein $R^1$ is $CF_3$;
M is Pb; and
X is I.
* * * * *

UNITED STATES PATENT AND TRADEMARK OFFICE
CERTIFICATE OF CORRECTION

| | | |
|---|---|---|
| PATENT NO. | : 12,185,623 B2 | Page 1 of 1 |
| APPLICATION NO. | : 17/464630 | |
| DATED | : December 31, 2024 | |
| INVENTOR(S) | : Peixi Wang et al. | |

It is certified that error appears in the above-identified patent and that said Letters Patent is hereby corrected as shown below:

In the Specification

Column 8, Line 6, "from undistorted 1800 to highly distorted 150°, the bandgap" should read --from undistorted 180° to highly distorted 150°, the bandgap--.

Signed and Sealed this
Twenty-fifth Day of February, 2025

Coke Morgan Stewart
*Acting Director of the United States Patent and Trademark Office*